US008319422B2

(12) United States Patent
Abe

(10) Patent No.: US 8,319,422 B2
(45) Date of Patent: Nov. 27, 2012

(54) ELECTROLUMINESCENT ELEMENT AND LIGHT-EMITTING DEVICE

(75) Inventor: Hiroko Abe, Tokyo (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 12/983,354

(22) Filed: Jan. 3, 2011

(65) Prior Publication Data
US 2011/0095679 A1    Apr. 28, 2011

Related U.S. Application Data

(63) Continuation of application No. 10/819,282, filed on Apr. 7, 2004, now Pat. No. 7,862,906.

(30) Foreign Application Priority Data

Apr. 9, 2003 (JP) ................. 2003-105135

(51) Int. Cl.
H01J 1/62 (2006.01)
B41B 1/20 (2006.01)
B66F 3/00 (2006.01)
(52) U.S. Cl. .................. 313/504; 257/40; 257/103
(58) Field of Classification Search .............. None
See application file for complete search history.

(56) References Cited

U.S. PATENT DOCUMENTS

| 4,769,242 A | 9/1988 | Shibanai |
| 4,769,292 A | 9/1988 | Tang et al. |
| 5,283,132 A | 2/1994 | Ogura et al. |
| 6,097,147 A | 8/2000 | Baldo et al. |
| 6,445,005 B1 | 9/2002 | Yamazaki et al. |
| 6,656,608 B1 | 12/2003 | Kita et al. |
| 6,657,260 B2 | 12/2003 | Yamazaki et al. |
| 6,830,828 B2 | 12/2004 | Thompson et al. |
| 6,863,997 B2 | 3/2005 | Thompson et al. |
| 6,869,695 B2 | 3/2005 | Thompson et al. |
| 6,872,472 B2 | 3/2005 | Liao et al. |
| 6,887,592 B2 | 5/2005 | Hieda et al. |
| 6,893,743 B2 | 5/2005 | Sato et al. |

(Continued)

FOREIGN PATENT DOCUMENTS

JP    2001-181617 A    7/2001

(Continued)

OTHER PUBLICATIONS

C.W. Tang et al.; "Organic electroluminescent diodes"; Applied Physics Letters, vol. 51, No. 12; pp. 913-915; Sep. 1987.

(Continued)

Primary Examiner — Camie Thompson
(74) Attorney, Agent, or Firm — Fish & Richardson P.C.

(57) ABSTRACT

An electroluminescent element which can easily control the balance of color in white emission (white balance) is provided according to the present invention. The electroluminescent element comprises a first light-emitting layer containing one kind or two or more kinds of light-emitting materials, and a second light-emitting layer containing two kinds of light-emitting materials (a host material and a phosphorescent material) in which the phosphorescent material is doped at a concentration of from 10 to 40 wt %, preferably, from 12.5 to 20 wt %. Consequently, blue emission can be obtained from the first light-emitting layer and green and red (or orange) emission can be obtained from the second light-emitting layer. An electroluminescent element having such device configuration can easily control white balance since emission peak intensity changes at the same rate in case of increasing a current density.

23 Claims, 10 Drawing Sheets

U.S. PATENT DOCUMENTS

| | | | |
|---|---|---|---|
| 6,894,312 B2 | 5/2005 | Yamazaki et al. |
| 6,911,271 B1 | 6/2005 | Lamansky et al. |
| 6,939,624 B2 | 9/2005 | Lamansky et al. |
| 6,942,931 B2 | 9/2005 | Lee et al. |
| 6,951,694 B2 | 10/2005 | Thompson et al. |
| 7,060,370 B2 | 6/2006 | Kinoshita et al. |
| 7,060,371 B2 | 6/2006 | Akiyama et al. |
| 7,148,502 B2 | 12/2006 | Yamazaki et al. |
| 7,211,823 B2 | 5/2007 | Tung et al |
| 7,381,479 B2 | 6/2008 | Lamansky et al. |
| 7,553,560 B2 | 6/2009 | Lamansky et al. |
| 2002/0025419 A1 | 2/2002 | Lee et al. |
| 2002/0027416 A1 | 3/2002 | Kim et al. |
| 2002/0113546 A1 | 8/2002 | Seo et al. |
| 2003/0017361 A1 | 1/2003 | Thompson et al. |
| 2003/0054199 A1 | 3/2003 | Oh |
| 2003/0129452 A1 | 7/2003 | Tsuji et al. |
| 2004/0144974 A1 | 7/2004 | Lee et al. |
| 2004/0151829 A1 | 8/2004 | Boroson et al. |
| 2004/0169461 A1 | 9/2004 | Moriyama et al. |
| 2004/0183082 A1 | 9/2004 | Yamazaki |
| 2004/0202893 A1 | 10/2004 | Abe |
| 2004/0262576 A1 | 12/2004 | Thompson et al. |
| 2004/0263066 A1 | 12/2004 | Abe et al. |
| 2005/0077817 A1 | 4/2005 | Yamazaki et al. |
| 2005/0100660 A1 | 5/2005 | Ito et al. |
| 2005/0123791 A1 | 6/2005 | Deaton et al. |
| 2005/0162092 A1 | 7/2005 | Yamazaki et al. |
| 2005/0202278 A1 | 9/2005 | Mishima et al. |
| 2006/0024526 A1 | 2/2006 | Thompson et al. |

FOREIGN PATENT DOCUMENTS

| | | |
|---|---|---|
| JP | 2002-334787 A | 11/2002 |
| JP | 2002-334789 A | 11/2002 |
| JP | 2003-012777 A | 1/2003 |
| JP | 2003-045676 A | 2/2003 |
| JP | 2004-506305 A | 2/2004 |
| WO | WO 02/15645 A1 | 2/2002 |
| WO | WO 03/059015 A1 | 7/2003 |

OTHER PUBLICATIONS

Junji Kido et al.; "Multilayer White Light-Emitting Organic Electroluminescent Device"; Science, vol. 267; pp. 1332-1334; Mar. 1995.

Brian W. D'Andrade et al.; "White Light Emission Using Triplet Excimers in Electrophosphorescent Organic Light-Emitting Devices"; Advanced Materials, vol. 14, No. 15; pp. 1032-1036; Aug. 2002.

Siu-Wai Lai et al.; "Probing d8-d8 Interactions in Luminescent Mono- and Binuclear Cyclometalated Platinum(II) Complexes of 6-Phenyl-2,2'—bipyridines"; Inorganic Chemistry, vol. 38, No. 18; pp. 4046-4055; 1999.

Siu-Wai Lai et al.; "Spectroscopic Properties of Luminescent Platinum(II) Complexes Containing 4,4',4"—Tri-tert-butyl-2,2':6',2"—terpyridine (tBu3tpy). Crystal Structures of [Pt(tBu3tpy)Cl]ClO4 and [Pt(tBu3tpy){CH2C(O)Me}]ClO4"; Inorganic Chemistry, vol. 38, No. 19; pp. 4262-4267; 1999.

Per-Inge Kvam et al.; "Spectroscopic and Electrochemical Properties of Some Mixed-Ligand Cyclometalated Platinum (II) Complexes Derived from 2-Phenylpyridine"; Acta Chemica Scandinavica, vol. 49; pp. 335-343; 1995.

J. Kido et al.; "Bright White-light-emitting Organic EL Device"; 46th Applied Physics Relation Union Lecture Meeting—28a—ZD—25; pp. 1281; 1999.

Hiroko Abe (formerly "Hiroko Yamazaki"); U.S. Appl. No. 10/793,861, filed Mar. 8, 2004; Entitled: "Light Emitting Element and Light Emitting Device"; 37 pages and 10 sheets of drawings.

Office Action dated May 5, 2006 (U.S. Appl. No. 10/793,861), 8 pages.

Office Action (U.S. Appl. No. 10/793,861) Dated Nov. 16, 2006 (8 pages).

"Highly efficient phosphorescent emission from organic electroluminescent devices", Baldo et al., Nature, vol. 395, pp. 151-154, Sep. 1998.

Office Action issued by the USPTO in U.S. Appl. No. 10/793,861, Dated Oct. 22, 2007 (10 pages).

Office Action issued by the USPTO in U.S. Appl. No. 10/793,861, Dated May 13, 2008 (12 pages).

ELECTROLUMINESCENT ELEMENT AND LIGHT-EMITTING DEVICE

CROSS-REFERENCE TO RELATED APPLICATIONS

This application is a continuation of U.S. application Ser. No. 10/819,282, filed Apr. 7, 2004, now U.S. Pat. No. 7,862,906, which claims the benefit of a foreign priority application filed in Japan as Serial No. 2003-105135 on Apr. 9, 2003, both of which are incorporated by reference.

BACKGROUND OF THE INVENTION

1. Field of the Invention

The present invention relates to an electroluminescent element comprising an anode, a cathode, and a layer including organic compounds (hereinafter, an electroluminescent layer) which emit light by applying current through the pair of electrodes; and a light-emitting device which comprises the electroluminescent layer. More specifically, this invention relates to an electroluminescent element which exhibits white light emission, and a full color light-emitting device comprising the electroluminescent element.

2. Related Art

An electroluminescent element comprises an electroluminescent layer interposed between a pair of electrodes (anode and cathode). The emission mechanism is as follows. Upon applying voltage through the pair of electrodes, holes injected from an anode and electrons injected from a cathode are recombined with each other within the electroluminescent layer to result in the formation of molecular excitons, and the molecular excitons return to the ground state while radiating energy to emit photon. There are two excited states possible from organic compounds, a singlet state and a triplet state. It is considered that light emission is possible through both the singlet state and the triplet state.

Although an electroluminescent layer may have a single layer structure comprising only a light-emitting layer formed by a light-emitting material, the electroluminescent layer is formed to have not only a single layer structure comprising only a light-emitting layer but also a lamination layer structure having a hole injecting layer, a hole transporting layer, a hole blocking layer, an electron transporting layer, an electron injecting layer, and the like which are formed by a plurality of functional materials.

It is known that color tone can be appropriately changed by doping tiny amounts of fluorescent substances (typically, at most approximately $10^{-3}$ mol % based on the value of host substances) into host substances within the light-emitting layer. (For example, refer to Japanese Patent Publication No. 2,814,435.)

Besides, the following are known as methods for changing color tone. Blue light emission obtained from a light-emitting layer is used as a light emission source, and the obtained emission color is converted into desired color within a color changing layer formed by color changing materials (hereinafter, CCM method). Alternatively, white light emission obtained from a light-emitting layer is used as a light emission source, and the obtained emission color is converted into desired color by a color filter (hereinafter, CF method).

However, in case of adopting the CCM method, there has been a problem in red color since color conversion efficiency of from blue to red is poor in principle. In addition, there has been a problem that the contrast becomes deteriorated from light emission in pixels due to outside light such as sunlight since color conversion materials are fluorescent materials. Therefore, it is considered that CF method without such problems is preferably used.

In the case of using CF method, an electroluminescent element exhibiting white light emission (hereinafter, white light emission element) having high luminance is required since much light is absorbed in a color filter.

With respect to the white light emission element, elements formed by various materials to have various configurations have been reported. It is quite important to control the balance of emission color (white balance) since white light emission is obtained by a plurality of materials, each of which emits different color, meanwhile it is difficult to do that.

For example, in the case that white light emission is obtained by mixing a plurality of materials, each of which exhibits emission in blue, green and red colors, it has been reported that an emission peak intensity of each the materials is different depending on current density. (For example, refer to Brien W. D'Andrede, Jason Brooks, Vadim Adamovich, Mark E. Thompson, and Stephen R. Forrest, Advanced Material (2002), 14, No. 15, Aug. 5, 1032-1036 (FIG. 2)) In case of forming such element, peak intensity of each emission color changes in different rates. Consequently, it becomes extremely difficult to control white balance which is adjusted by the parameter which determines the peak intensity of these emission colors.

SUMMARY OF THE INVENTION

It is an object of the present invention to provide an electroluminescent element which can be easily controlled the color balance in white light emission (white balance).

As the result of research for solving the above mentioned problems, the inventor found that the rate of changes of peak intensity becomes hardly changed depending on light-emitting materials even when a current density is increased by keeping the concentration of light-emitting materials among a plurality of light-emitting materials used for obtaining white light emission in a certain range.

In view of the foregoing, an electroluminescent layer in an electroluminescent element comprises a first light-emitting layer containing one kind or two or more kinds of light-emitting materials; and a second light-emitting layer containing two kinds of light-emitting materials in which one of them is doped at a concentration of from 10 to 40 wt %, preferably, from 12.5 to 20 wt %.

In the above described structure, blue emission having an emission peak intensity in the wavelength region of from 400 to 500 nm can be obtained from the first light-emitting layer by using one kind or two or more kinds of light-emitting materials; and green emission having an emission peak intensity in the wavelength region of from 500 to 550 nm and red (or orange) emission having an emission peak intensity in the wavelength region of from 550 to 700 nm can be obtained from the second light-emitting layer by using two kinds of light-emitting materials, host materials and phosphorescent materials, to dope phosphorescent materials at a concentration of from 10 to 40 wt %, preferably, 12.5 to 20 wt %. However, as the phosphorescent materials, materials which can result in the formation of an excited dimer (excimer) formed by the bond of excited atoms or molecules with ground state atoms or molecules are used here.

As stated above, the first light-emitting layer exhibiting blue emission and the second light-emitting layer exhibiting green and red (or orange) emission are formed separately. In consequence, there is an advantage that the electroluminescent element becomes easy to manufacture since the control of the concentration or the like for forming the first light-emitting layer becomes facilitated. Further, compared with the case that all color emission is obtained from one light-emitting layer, it can be expected that the varies of emission wavelength, the decrease of peak intensity, or the like due to the interaction of molecules having different structures from each other (exciplex) within a light-emitting layer is prevented.

Further, by doping phosphorescent materials into the second light-emitting layer within the above described concentration ranges, not only the number of excimer formed from phosphorescent materials can be controlled, but also the light emission (green emission and red emission) can be obtained from the second light-emitting layer simultaneously with blue emission from the first light-emitting layer. In this case, the peak intensity of phosphorescent emission (green emission) obtained from phosphorescent materials and emission (red (or orange)) from excimer (the peak intensity of both the emission can be considered to be the same because the intensity ratio is depending on the concentration) and the peak intensity of blue emission from the first light-emitting layer changes at the almost same rate in case of increasing current density, hence, the peak intensity is easy to control and white light emission with well white balanced can be easily obtained.

Therefore, one of constituent features of the invention is that an electroluminescent element comprises an electroluminescent layer interposed between a pair of electrodes wherein the electroluminescent layer comprises at least a first light-emitting layer and a second light-emitting layer, each of which has an emission peak in a wavelength region of from 500 to 700 nm; and the second light-emitting layer contains a phosphorescent material which forms excimer at a concentration of from 10 to 40 wt %, preferably, from 12.5 to 20 wt %.

Another constituent features of the invention is that an electroluminescent element comprises an electroluminescent layer interposed between a pair of electrodes wherein the electroluminescent layer comprises at least a first light-emitting layer and a second light-emitting layer, each of which has an emission peak in a wavelength region of from 500 to 700 nm; and the second light-emitting layer contains a phosphorescent material which forms excimer at a concentration of at least $10^{-4}$ mol/cm$^3$ and at most $10^{-3}$ mol/cm$^3$.

By setting a concentration of the phosphorescent material within the above described ranges, an emission peak intensity of green light emission (occurred in a wavelength region of from 500 to 550 nm) to red (or orange) light emission (occurred in a wavelength region of from 550 to 700 nm) has a ratio of from 50 to 150%, preferably, from 70 to 130%.

Additionally, by setting a concentration of the phosphorescent material within the above described ranges, a luminance of from 100 to 2000 cd/m$^2$, preferably, from 300 to 1000 cd/m$^2$ is obtained from the electroluminescent element.

More additionally, by setting a concentration of the phosphorescent material within the above described ranges, a part of the phosphorescent material can be existed at a certain distance from one another so that the molecules of the phosphorescent material can form excimer emission.

Besides, by setting a concentration of the phosphorescent material within the above described ranges, the phosphorescent material formed by a metal complex can be existed so that central metals of the phosphorescent materials are a distance of from 2 to 20 Å from one another.

In the above each constituent features, the second light-emitting layer is formed to have preferably the thickness of from 20 to 50 nm, more preferably, from 25 to 40 nm.

Further, in the above each constituent features, the first light-emitting layer has an emission spectrum with an emission peak in a wavelength region of from 400 to 500 nm; the second light-emitting layer has an emission spectrum with an emission peak in a wavelength region of from 500 to 700 nm; and any one of the plurality of emission peaks is excimer emission.

In the above each constituent features, the phosphorescent material is organic metal complex with platinum as a central metal.

The invention comprehends an electric appliance and a light-emitting device, each of which comprises the above described electroluminescent element.

Accordingly, an electroluminescent element can be provided which can be controlled easily the color balance in white light emission (white balance) by keeping the concentration so as to be within a certain range of light-emitting materials among a plurality of light-emitting materials used for obtaining white light emission.

These and other objects, features and advantages of the invention will become more apparent upon reading of the following detailed description along with the accompanied drawings.

DESCRIPTION OF THE INVENTION

Figure 1A:
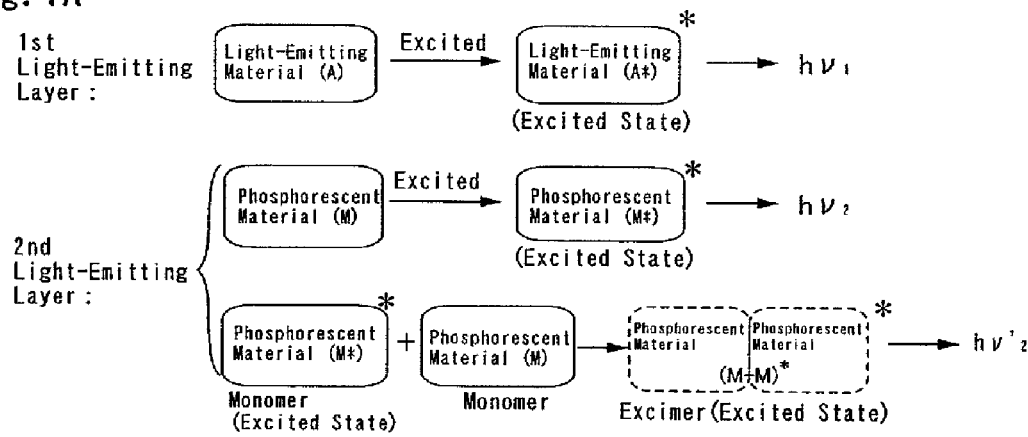
FIGS. 1A to 1C are views showing light emission mechanism of an electroluminescent element according to the present invention.

An electroluminescent element according to the present invention comprises a pair of electrodes (an anode and a cathode) and an electroluminescent layer having at least a first light-emitting and a second light-emitting layer interposed between the pair of electrodes. As shown in FIG. 1A, within the first light-emitting layer, light-emitting materials are excited by recombination of carriers, and monomers in excited states are formed, then, light-emission is obtained (blue emission: $hv_1$). Within the second light-emitting layer, phosphorescent materials are excited by recombination of carriers, and monomers in excited states are formed, then, phosphorescent emission is obtained (green emission: hv2). Simultaneously, within the second light-emitting layer, monomer in the excited state and monomer in the ground state form an excited dimer (excimer), and excimer emission (red (or orange): $hv_2'$) can also be obtained.

Figure 1B:
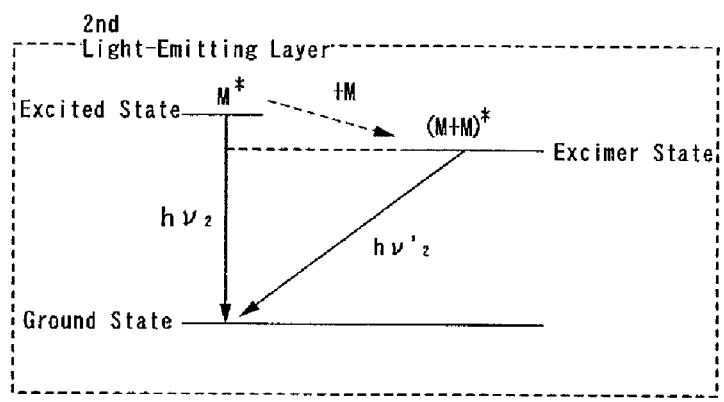

Within the second light-emitting layer, since an energy state of the excimer state obtained from phosphorescent materials is lower than that of the excited state obtained from phosphorescent materials as shown in FIG. 1B, the excimer emission ($hv_2'$) is always at longer wavelength side than the general phosphorescent light emission ($hv_2$) (specifically, at least several ten nm longer wavelength side). Therefore, in the case that phosphorescent materials which can generate phosphorescent emission at a green emission wavelength region are used as in the invention, excimer emission is at the red emission wavelength region. Hence, according to the invention, by combining green emission and red emission from phosphorescent materials with blue emission from another light-emitting materials, high efficient white light emission having peak intensity in each red, green, and blue wavelength region can be obtained.

Figure 1C:
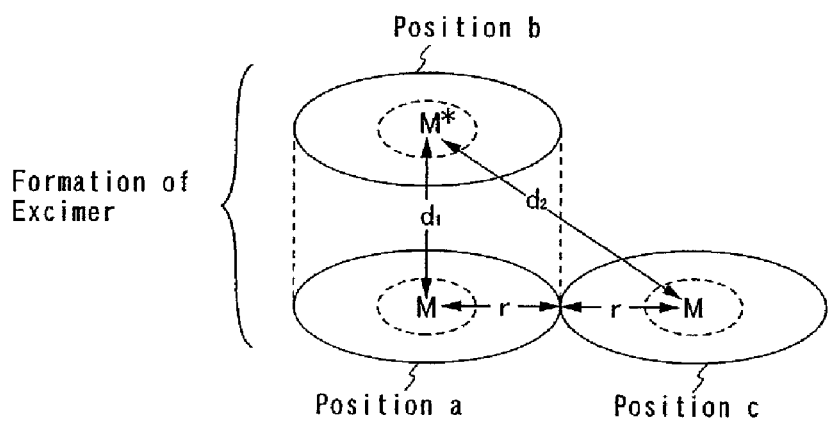

For forming an excimer state from phosphorescent materials, it is required to make it easier for monomer in an excited state and monomer in a ground state to form an excited dimer by their interaction. Specifically, phosphorescent materials are preferably doped into host materials at concentration of from 10 wt % to 40 wt %, more preferably, from 12.5 wt % to 20 wt % within the second light-emitting layer. Besides, phosphorescent materials having high planarity structures such as platinum complex are preferably used as guest materials to keep the distance between central ions (or atoms) of the phosphorescent materials within a certain range. According to the invention, in the case that the phosphorescent materials (monomer) in a ground state and phosphorescent materials (monomer) in an excimer state are respectively at the position denoted by (a) and the position denoted by (b) as shown in FIG. 1C, the distance between central ions ($d_1$) is preferably from 2 to 5 Å. However, phosphorescent materials (monomer) in a ground state can interact with phosphorescent materials (monomer) in an excited state even when the phosphorescent materials (monomer) in a ground state are at the position denoted by (c). Further, in consideration that the average radius (r) in a molecular structure of phosphorescent materials according to the invention is approximately from 6 to 9 Å, the distance between central ions ($d_2$) is preferably $2 Å \leq d_2 \leq 20 Å$.

The first light-emitting layer exhibiting blue emission can be formed by a single substance (blue luminous body), or host materials and guest materials (blue luminous body).

For forming an electroluminescent element according to the invention, a device design is required so that both the first light-emitting layer and the second light-emitting layer to emit light. Specifically, the relationship of ionization potential among the first light-emitting layer, the second light-emitting layer, and another layers, each of which composes an electroluminescent layer is required to be most appropriate.

In addition, the device design becomes different depending on the configuration of functional layers composing an electroluminescent layer, subsequently, preferred embodiment of the invention will be described in terms of the relationship between a device configuration and a band diagram hereinafter.

[Embodiment 1]

Figure 2A:
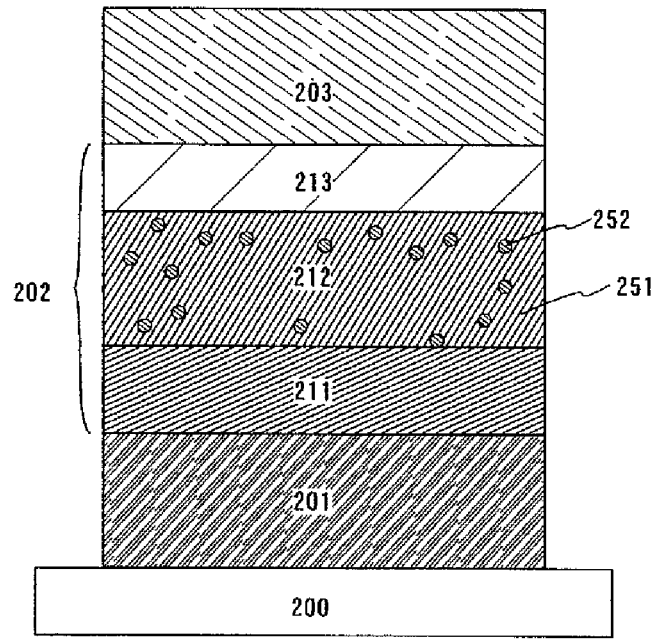
FIGS. 2A and 2B are band diagrams showing a device configuration of an electroluminescent element according to the invention.

In Embodiment 1, as shown in FIG. 2A, the case that a first electrode 201, an electroluminescent layer 202, and a second electrode 203 are formed over a substrate 200, and that the electroluminescent layer 202 has a lamination structure comprising a first light-emitting layer 211, a second light-emitting layer 212, and an electron transporting layer 213 will be explained. In addition, the first light-emitting layer 211 includes a light-emitting body. The second light-emitting layer 212 comprises host materials 251 and phosphorescent materials 252 which serve as a light-emitting body. The phosphorescent materials can generate both phosphorescent emission and excimer emission.

As a light-emitting body (light-emitting material) for the first light-emitting layer 211, blue fluorescent materials having hole transportation properties such as N,N'-bis(3-methylphenyl)-N,N'-diphenyl-1,1'-biphenyl-4,4'-diamine (abbreviated TPD) or derivatives thereof such as 4,4'-bis[N-(1-naphthyl)-N-phenyl-amino]-biphenyl (hereafter, referred to as α-NPD); or blue fluorescent materials having electron transportation properties such as bis(2-methyl-8-quinolinolate)-(4-hydroxy-biphenylyl)-aluminum (abbreviated BAlq) or bis[2-(2-hydroxyphenyl)-benzooxazolate]zinc (abbreviated $Zn(BOX)_2$). Various blue fluorescent dyes, for example, perylene, 9,10-diphenyl anthracene, or coumarin based fluorescent dyes (coumarin 30 or the like) can be used as guest materials. Further, phosphorescent materials such as bis(4,6-difluorophenyl)pyridinato-$N,C^{2'}$) (acetylacetonato)iridium (abbreviated $Ir(Fppy)_2(acac)$) can be used. All of these materials have emission peak intensity in the wavelength region of from 400 to 500 nm, so that they are suitable for materials for the light-emitting body of the first light-emitting layer 211 according to the invention.

An organic metal complex with platinum as a central metal is efficiently used for a light-emitting body (phosphorescent material) of the second light-emitting layer 212. Specifically, by doping substances represented by the structural formulas 1 to 4 at concentration of from 10 wt % to 40 wt %, preferably, from 12.5 wt % to 20 wt % into host materials, both phosphorescent emission and its excimer emission can be obtained. However, the present invention is not limited thereto, any phosphorescent material can be used as long as both phosphorescent emission and excimer emission can be simultaneously obtained therefrom.

[Formula 1]

(1)

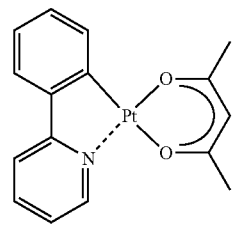

[Formula 2]

(2)

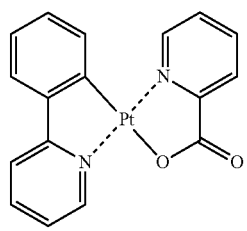

-continued

[Formula 3]

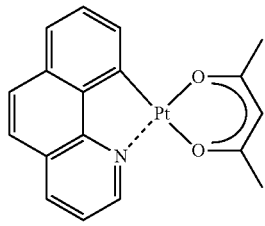

(3)

[Formula 4]

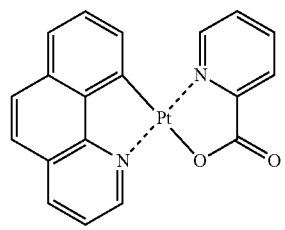

(4)

In case of using guest materials for the first light-emitting layer and the second light-emitting layer comprising a light-emitting body, hole transportation materials or electron transportation materials typified by the following examples can be used. In addition, bipolar materials such as 4,4'-N,N'-dicarbazolyl-biphenyl (abbreviated CBP) can be used as host materials.

As hole transportation materials, aromatic amine (that is, the one having a benzene ring-nitrogen bond) compounds are preferably used. For example, N,N'-bis(3-methylphenyl)-N,N'-diphenyl-1,1'-biphenyl-4,4'-diamine (abbreviated TPD) or derivatives thereof such as 4,4'-bis[N-(1-naphthyl)-N-phenyl-amino]-biphenyl (abbreviated α-NPD) is widely used. Also used are star burst aromatic amine compounds, including: 4,4',4''-tris(N,N-diphenyl-amino)-triphenyl amine (abbreviated TDATA); and 4,4',4''-tris[N-(3-methylphenyl)-N-phenyl-amino]-triphenyl amine (abbreviated MTDATA).

As electron transportation materials, metal complexes such as tris(8-quinolinolate) aluminum (abbreviated $Alq_3$), tris(4-methyl-8-quinolinolate) aluminum (abbreviated $Almq_3$), bis(10-hydroxybenzo[h]-quinolinato) beryllium (abbreviated $BeBq_2$), BAlq, $Zn(BOX)_2$, and bis[2-(2-hydroxyphenyl)-benzothiazolate]zinc (abbreviated $Zn(BTZ)_2$). Additionally, oxadiazole derivatives such as 2-(4-biphenyl)-5-(4-tert-butylphenyl)-1,3,4-oxadiazole (abbreviated PBD), and 1,3-bis[5-(p-tert-butylphenyl)-1,3,4-oxadiazole-2-yl]benzene (abbreviated OXD-7); triazole derivatives such as 3-(4-tert-butylphenyl)-4-phenyl-5-(4-biphenylyl)-1,2,4-triazole (abbreviated TAZ) and 3-(4-tert-butylphenyl)-4-(4-ethylphenyl)-5-(4-biphenylyl)-1,2,4-triazole (abbreviated p-EtTAZ); imidazol derivatives such as 2,2',2''-(1,3,5-benzenetryil)tris[1-phenyl-1H-benzimidazole] (abbreviated TPBI); and phenanthroline derivatives such as bathophenanthroline (abbreviated BPhen) and bathocuproin (abbreviated BCP) can be used in addition to metal complexes.

In addition, the above described electron transporting materials can be used for the electron transporting layer 213.

Figure 2B:
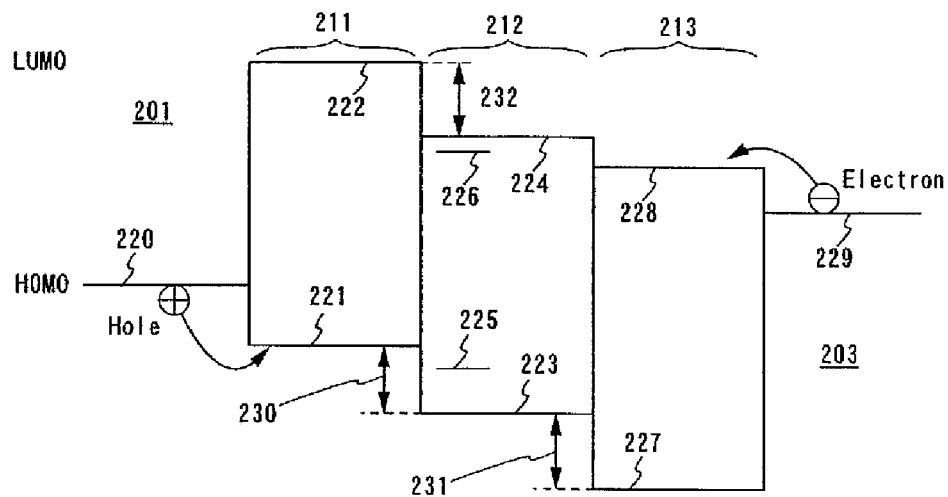

FIG. 2B is a band diagram in case of forming a device having the above described configuration. The diagram shows a HOMO level (ionization potential) 220 of the first light-emitting layer 201; a HOMO level (ionization potential) 221 and a LUMO level 222 of the first light-emitting layer 211; a HOMO level (ionization potential) 223 and a LUMO level 224 of host materials of the second light-emitting layer 212 in a thin film shape; a HOMO level (ionization potential) 225 and a LUMO level 226 of guest materials (phosphorescent materials) of the second light-emitting layer 212; a HOMO level (ionization potential) 227 and a LUMO level 228 of the electron transporting layer 213; and a LUMO level 229 of the second electrode 203, respectively.

In this instance, an energy gap 230 between the ionization potential 221 of the first light-emitting layer 211 and the ionization potential (in this instance, the ionization potential of the host materials 251 is considered that of the whole second light-emitting layer 212) 223 of the whole second light-emitting layer 212 (in the state that both the host materials 251 and the phosphorescent materials 252 are included) is preferably sufficiently large (specifically, at least 0.4 eV). If the energy gap 230 is small, holes inject to the second light-emitting layer 212 from the first light-emitting layer 211 since the first light-emitting layer 211 has hole transportation properties. Consequently, the majority of carriers are recombined within the second light-emitting layer 212. Therefore, since the second light-emitting layer 212 exhibits emission of the wavelength region of green to red, energy cannot transfer to the first light-emitting layer 211 which exhibits blue emission of further shorter wavelength. Accordingly, only the second light-emitting layer emits light.

By making the energy gap 230 sufficiently large, the majority of carriers are recombined with each other at the vicinity of an interface between the first light-emitting layer 211 and the second light-emitting layer 212. The other small number of carries are recombined within the second light-emitting layer 212, or trapped partly in the HOMO level 214 of the phosphorescent materials, consequently, both the light-emitting layer 211 and the second light-emitting layer 212 can emit light.

The same is true in the case that guest materials generating blue emission are contained in the host materials within the first light-emitting layer 211. That is, the energy gap 230 between the ionization potential 221 of the whole light-emitting layer 211 (in the state that both host materials of the first light-emitting layer and the guest materials generating blue emission are included) and the ionization potential 223 of the whole second light-emitting layer 212 (in the state that both the host materials 251 of the second light-emitting layer and the phosphorescent materials 252 are included) is preferably large (specifically, at least 0.4 eV).

Further, an energy gap 231 between the ionization potential 223 of the whole second light-emitting layer 212 (in the state that both the host materials 221 and the phosphorescent materials 222 are included) and the ionization potential 227 of the electron transporting layer 213 is preferably large (specifically, at least 0.4 eV). In this instance, by making the energy gap 231 large, holes serving as carriers can be trapped in the second light-emitting layer 212, hence, carriers can be efficiently recombined within the second light-emitting layer 212.

Moreover, an energy gap 232 between the LUMO level 222 of the first light-emitting layer 211 and the LUMO level (in this instance, the LUMO level of the host materials is considered that of the whole second light-emitting layer) 224 of the whole second light-emitting layer 212 (in the state that both the host materials 251 and the phosphorescent materials 252 are included) is preferably large (specifically, at least 0.4 eV). In this instance, by making the energy gap 232 large, holes serving as carriers can be trapped in the second light-emitting layer 212, hence, recombination can be took place efficiently in the second light-emitting layer 212.

Therefore, light emission from the first light-emitting layer 211 and the second light-emitting layer 212 can be further efficiently obtained by a band-gap structure having energy gaps 230, 231, and 232 in Embodiment 1.

[Embodiment 2]

Figure 3A:
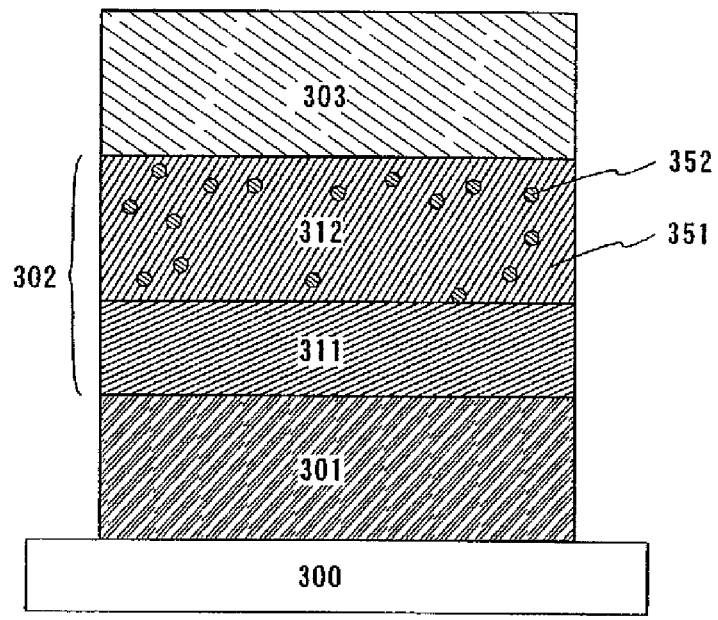
FIGS. 3A and 3B are band diagrams showing a device configuration of an electroluminescent element according to the invention.

In Embodiment 2, the case that a first electrode 301, an electroluminescent layer 302, and a second electrode 303 are formed over a substrate 300, and the electroluminescent layer 302 has a lamination structure comprising a first light-emitting layer 311 and a second light-emitting layer 312 will be explained with reference to FIG. 3A. In addition, second light-emitting layer 312 comprises host materials 351 and phosphorescent materials 352. The phosphorescent materials can generate phosphorescent emission and excimer emission.

Embodiment 2 is distinguished from Embodiment 1 by the fact that the electroluminescent layer does not comprise the electron transporting layer, and so Embodiment 2 has an advantage that the process for forming the electron transporting layer can be omitted. In addition, materials having excellent electron transportation properties are preferably used as host materials 321 for the second light-emitting layer 312 in order to keep luminous efficiency.

In Embodiment 2, materials for forming the first light-emitting layer 311 and the second light-emitting layer 312 are the same as those described in Embodiment 1.

Figure 3B:
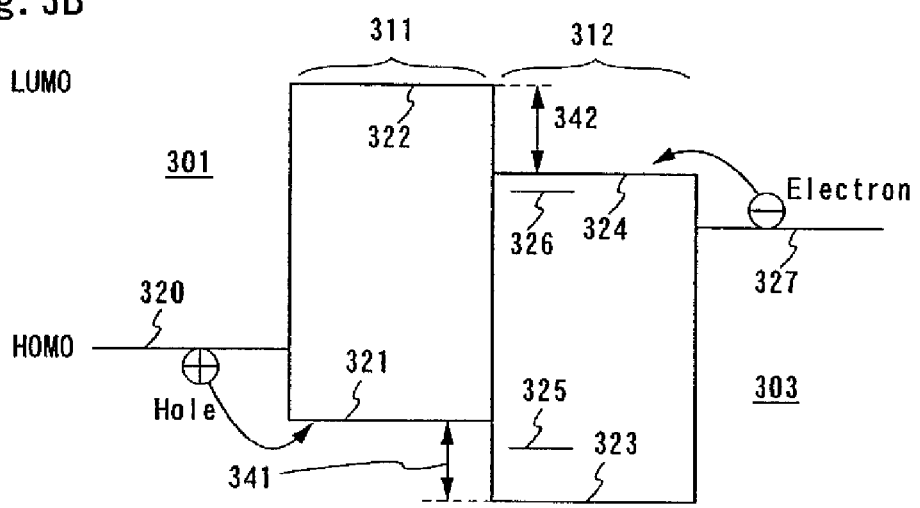

FIG. 3B is a band diagram in case of forming a device having the above described configuration. The diagram shows a HOMO level (ionization potential) 320 of the first light-emitting layer 301; a HOMO level (ionization potential) 321 and a LUMO level 322 of the first light-emitting layer 311; a HOMO level (ionization potential) 323 and a LUMO level 324 of host materials of the second light-emitting layer 312 in a thin film shape; a HOMO level (ionization potential) 325 and a LUMO level 326 of guest materials (phosphorescent materials) of the second light-emitting layer 312; and a LUMO level 327 of the second electrode 303, respectively.

In Embodiment 2 just as Embodiment 1, in order to obtain efficiently light from the first light-emitting layer 311 and the second light-emitting layer 312, an energy gap 341 between the ionization potential 321 of the first light-emitting layer 311 and the ionization potential (in this instance, the ionization potential of the host materials 351 is considered that of the whole second light-emitting layer 312) 323 of the whole second light-emitting layer 312 (in the state that both the host materials 351 and the phosphorescent materials 352 are included) is preferably sufficiently large (specifically, at least 0.4 eV). Further, an energy gap 342 between the LUMO level 322 of the first light-emitting layer 311 and the LUMO level (in this instance, the LUMO level of the host materials 351 is considered that of the whole second light-emitting layer 312) 324 of the whole second light-emitting layer 312 (in the state that both the host materials 351 and the phosphorescent materials 352 are included) is preferably sufficiently large (specifically, at least 0.3 eV).

The same is true in the case that guest materials generating blue emission are contained in host materials within the first light-emitting layer 311. That is, the energy gap 341 between the ionization potential (in this instance, the ionization potential of the host materials of the first light-emitting layer 311 is considered the ionization potential of the whole first light-emitting layer 311) 321 of the whole light-emitting layer 311 (in the state that both the host materials and the guest materials generating blue emission are included) and the ionization potential 323 of the whole second light-emitting layer 312 (in the state that both the host materials 351 and the phosphorescent materials 352 are included) is preferably large (specifically, at least 0.4 eV).

[Embodiment 3]

Figure 4A:
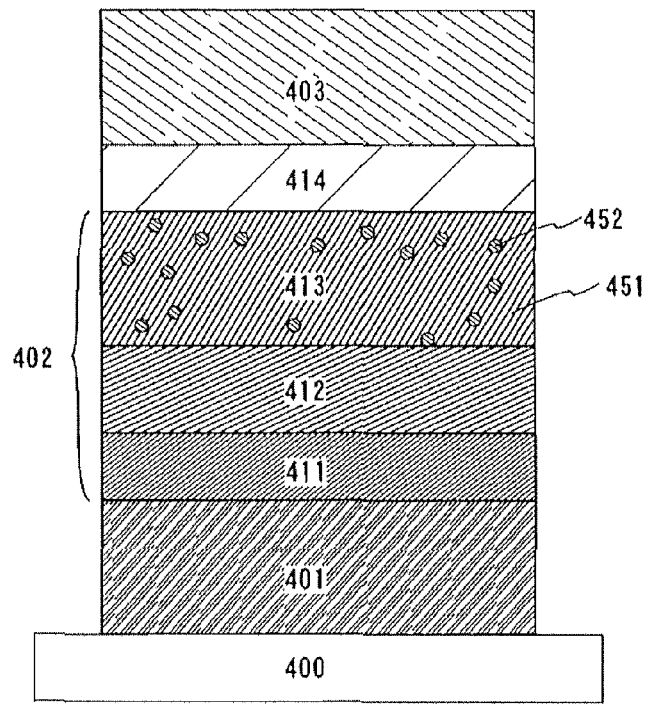
FIGS. 4A and 4B are band diagrams showing a device configuration of an electroluminescent element according to the invention.

In Embodiment 3, the case that a first electrode 401, an electroluminescent layer 402, and a second electrode 403 are formed over a substrate 400, and that the electroluminescent layer 402 has a lamination structure comprising a hole injecting layer 411, a first light-emitting layer 412, and a second light-emitting layer 413, and an electron transporting layer 414 will be explained with reference to FIG. 4A. In addition, second light-emitting layer 413 comprises host materials 451 and phosphorescent materials 452 that serve as a light-emitting body. The phosphorescent materials can generate phosphorescent emission and excimer emission.

As materials for the hole injecting layer 411, besides the above described hole transporting materials such as TPD, α-NPD, TDATA, or MTDATA, the following hole transporting materials can be used.

As hole injection materials, porphyrin compounds are useful among other organic compounds such as phthalocyanine (abbreviated $H_2$-Pc), copper phthalocyanine (abbreviated Cu-Pc), or the like. Further, chemical-doped conductive polymer compounds can be used, such as polyethylene dioxythiophene (abbreviated PEDOT) doped with polystyrene sulfonate (abbreviated PSS), polyaniline, or polyvinyl carbazole (abbreviated PVK). A thin film of an inorganic semiconductor such as vanadium pentoxide or an ultra thin film of an inorganic insulator such as aluminum oxide can also be used.

As a light-emitting body or materials for the first light-emitting layer 412, a second light-emitting layer 413, and an electron transporting layer 414, the same materials described in Embodiment 1 can be used, respectively.

Figure 4B:
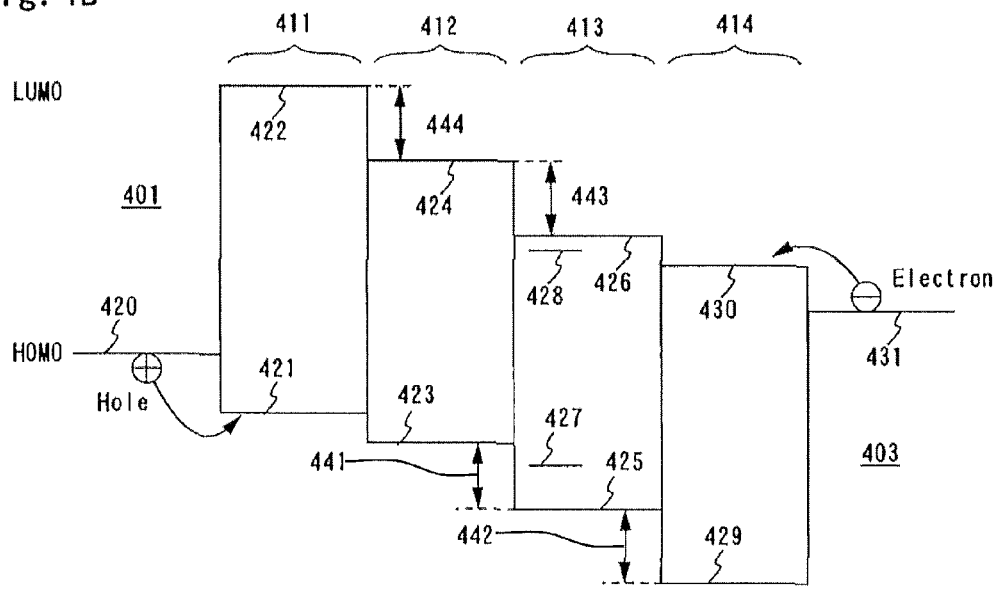

FIG. 4B is a band diagram in case of forming a device having the above described configuration. The diagram shows a HOMO level (ionization potential) 420 of the first electrode 401; a HOMO level (ionization potential) 421 and a LUMO level 422 of the hole injecting layer 411; a HOMO level (ionization potential) 423 and a LUMO level 424 of the first light-emitting layer 412; a HOMO level (ionization potential) 425 and a LUMO level 426 of host materials of the second light-emitting layer 413; a HOMO level (ionization potential) 427 and a LUMO level 428 of guest materials (phosphorescent materials) of the second light-emitting layer 413; a HOMO level (ionization potential) 429 and a LUMO level 430 of the electron transporting layer 414; and a LUMO level 431 of the second electrode 403, respectively.

The configuration described in Embodiment 3 is distinguished from that described in Embodiment 1 by the fact that the hole injecting layer 411 is included.

In Embodiment 3, in order to obtain light further efficiently from the first light-emitting layer 412 and the second light-emitting layer 413, an energy gap 441 between the ionization potential 423 of the first light-emitting layer 412 and the ionization potential (in this instance, the ionization potential of the host materials 451 is considered that of the whole second light-emitting layer 413) 425 of the whole second light-emitting layer 413 (in the state that both the host materials 451 and the phosphorescent material 452 are included) is preferably sufficiently large (specifically, at least 0.4 eV). Likewise, an energy gap 442 between the ionization potential 425 of the whole second light-emitting layer 413 (in the state that both the host materials 451 and the phosphorescent material 452 are included) and the ionization potential 429 of the electron transporting layer 414 is preferably sufficiently large (specifically, at least 0.4 eV). Additionally, an energy gap 443 between the LUMO level 424 of the first light-emitting layer 412 and the LUMO level (in this instance, the LUMO level of the host material 451 is considered that of the whole second light-emitting layer 413) 426 of the whole second light-emitting layer 413 (in the state that both the host materials 451 and the phosphorescent materials 452) is preferably sufficiently large (specifically, at least 0.3 eV). Moreover, an energy gap 444 between the LUMO level 422 of the hole injecting layer 411 and the LUMO level 423 of the first light-emitting layer 412 is preferably sufficiently large (specifically, at least 0.3 eV).

By holding the energy gap 444 between the LUMO level 422 of the hole injecting layer 411 and the LUMO level 423 of the first light-emitting layer 412, electrons can be trapped into the first light-emitting layer 412, and so carriers can be efficiently recombined with each other in the first light-emitting layer 412.

The same is true in the case that guest materials generating blue emission are contained in host materials within the first light-emitting layer 412. That is, an energy gap 441 between the ionization potential (in this instance, the ionization potential of host materials of the first light-emitting layer is considered that of the whole first light-emitting layer 412) 423 of the whole first light-emitting layer 412 (in the state that both the host materials and the guest materials generating blue emission are included) and the ionization potential 425 of the whole second light-emitting layer 413 (in the state that both the host materials 451 and the phosphorescent materials 452 are included) is preferably sufficiently large (specifically, at least 0.4 eV).

Accordingly, by applying the typical configurations described in Embodiments 1 to 3 according to the present invention, a white electroluminescent element having peak intensity in each wavelength region of red, green, and blue can be achieved with such a simple device configuration.

Further, the above described configuration is illustrative only as one of preferred configurations. An electroluminescent layer in a electroluminescent element according to the invention may comprise at least the above described first light-emitting layer and second light-emitting layer. Therefore, though not nominated in this specification, a layer having properties except light-emission properties (for example, an electron injection layer, or the like) which is known as used in the conventional electroluminescent element can be appropriately used.

As electron injection materials for forming an electron injecting layer, above described electron transportation materials can be used. Additionally, a ultra thin film of insulator, for example, alkaline metal halogenated compounds such as LiF or CsF; alkaline earth halogenated compounds such as $CaF_2$; or alkaline metal oxides such as $Li_2O$ is often used. Further, alkaline metal complexes such as lithium acetylacetonate (abbreviated Li(acac)), 8-quinolinolato-lithium (abbreviated Liq) can also be used.

An electroluminescent element according to the invention may be formed in such a way that at least either electrode is formed by transparent materials in order to extract light through either the electrode. Generally, the configuration that a first electrode formed over a substrate is transparent to light (also referred to as a bottom emission structure); the configuration that a second electrode which is stacked over an electroluminescent layer formed over the first electrode is transparent to light (also referred to as a top emission structure); or the configuration that both electrodes are transparent to light (also referred to as a dual emission structure) may be adopted.

As anode materials for either the first electrodes (201, 301, and 401) or the second electrodes (203, 303, and 403), conductive materials having large work functions are preferably used. When light is extracted through an anode, transparent conductive materials such as indium-tin oxides (ITO) or indium-zinc oxides (IZO) may be used. When an anode is formed to have light shielding properties, a single layer formed by TiN, ZrN, Ti, W, Ni, Pt, Cr, or the like; a lamination layer comprising the single layer and a film containing titanium nitride and aluminum as its main components; a three lamination layer comprising a titanium nitride film, a film containing aluminum as its main components, and a titanium nitride film; or the like can be used. Alternatively, the anode can be formed by stacking the above described transparent conductive materials over a reflective electrode of Ti, Al, or the like.

As materials for a cathode, conductive materials having small work functions are preferably used. Specifically, alkaline metals such as Li or Cs; alkaline earth metals such as Mg, Ca, or Sr; alloys of theses metals (Mg:Ag, Al:Li, or the like); or rare earth metals such as Yb or Er can be used. In addition, in case of using an electron injecting layer formed by LiF, CsF, $CaF_2$, $Li_2O$, or the like, the conventional conductive thin film such as aluminum can be used. In case of extracting light through cathode, the cathode can be formed to have a lamination structure comprising a ultra thin film containing alkaline metals such as Li or Cs, or alkaline earth metals such as Mg, Ca or Sr and a transparent conductive film (ITO, IZO, ZnO, or the like). Alternatively, the cathode may be formed by forming an electron injecting layer by alkaline metals or alkaline earth metals, forming electron transportation materials by co-evaporation, and stacking a transparent conductive film (ITO, IZO, ZnO, or the like) thereon.

In manufacturing the above described electroluminescent element according to the invention, a method for stacking each layer of the electroluminescent element is not limited. Any method of vacuum vapor deposition, spin coating, ink jetting, dip coating, or the like can be used, as long as layers can be stacked by these methods.

EXAMPLE 1

Hereinafter, examples of the present invention will be explained.

Figure 5:
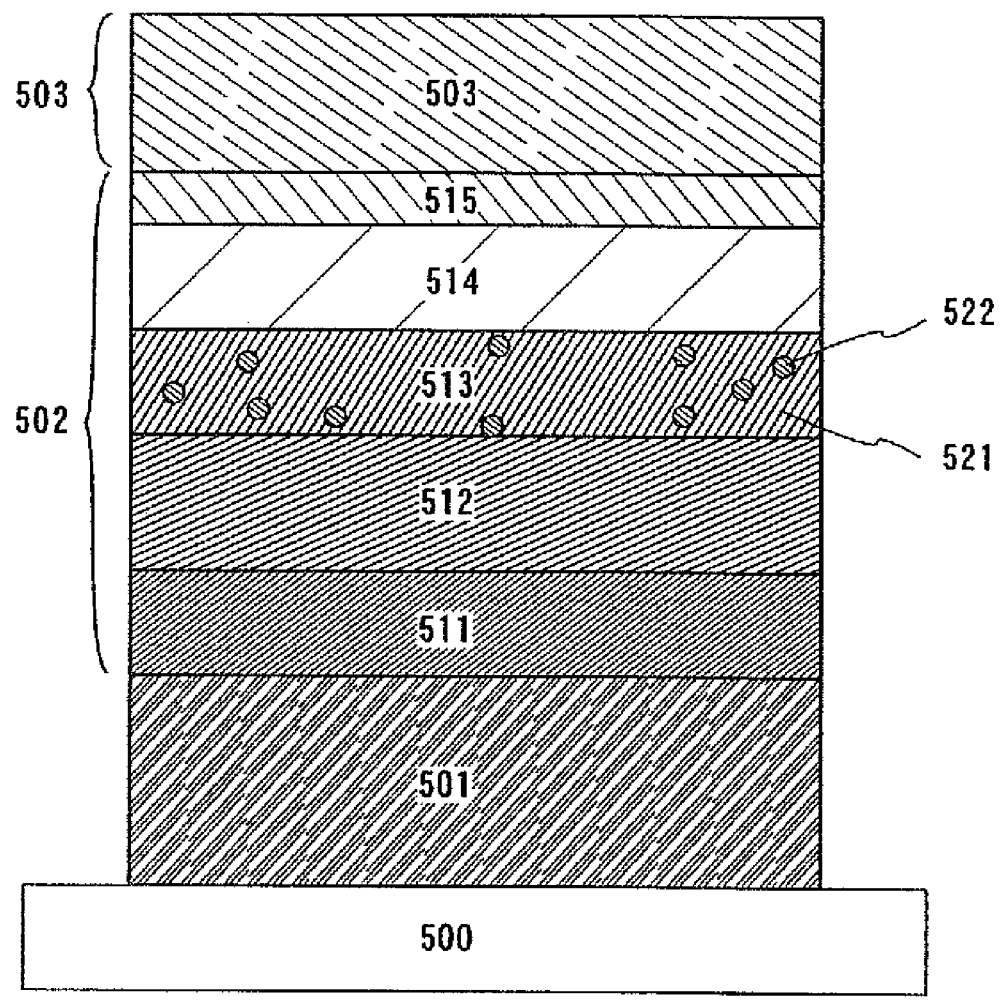
FIG. 5 is a view showing a specific device configuration of an electroluminescent element according to the invention.

In this example, a device configuration of an electroluminescent element and a method for manufacturing thereof according to the invention will be explained with reference to FIG. 5.

An anode 501 of the electroluminescent element was formed over a glass substrate 500 having an insulating surface. As a material for the anode 501, ITO, a transparent conductive film, is used. The anode 501 is formed by sputtering to have a thickness of 110 nm. The anode 501 is square in shape and 2 mm in height and width.

Then, an electroluminescent layer 502 is formed over the anode 501. In this example, the electroluminescent layer 502 has a lamination structure comprising a hole injecting layer 511; a first light-emitting layer 512 which has hole injection properties; a second light-emitting layer 513; an electron transporting layer 514; and an electron injecting layer 515. The first light-emitting layer 512 is formed by materials which can achieve blue emission, specifically, materials which has an emission spectrum with maximum intensity in the wavelength region of from 400 to 500 nm. In addition, the second light-emitting layer 513 is formed by host materials or guest materials which generate phosphorescent light emission.

First, a substrate provided with the anode 501 is secured with a substrate holder of a vacuum deposition system in such a way that the surface provided with the anode 501 is down. Then, Cu-Pc is put into an evaporation source installed in the internal of the vacuum deposition system. And then, the hole injection layer 511 is formed to have a thickness of 20 nm by vacuum vapor deposition with a resistive heating method.

Then, the first light-emitting layer 512 is formed by a material which has excellent hole transportation properties and light-emission properties. In this example, α-NPD is deposited in accordance with the same procedures as those conducted for forming the hole injection layer 511 to have a thickness of 30 nm.

And then, the second light-emitting layer 513 is formed. In this example, the second light-emitting layer 513 is formed by CBP as host materials and Pt(ppy)acac represented by the structural formula 1 as guest materials which are controlled to be 15 wt % in concentration to have a thickness of 20 nm by co-evaporation.

Further, the electron transporting layer 514 is formed over the second light-emitting layer 513. The electron transporting layer 514 is formed by BCP (bathocuproin) to have a thickness of 20 nm by vapor deposition. $CaF_2$ is deposited to have a thickness of 2 nm as the electron injection layer 515 thereon to complete the electroluminescent layer 502 having a lamination structure.

Lastly, a cathode 503 is formed. In this example, the cathode 503 is formed by aluminum (Al) by vapor deposition with a resistive heating method to have a thickness of 100 nm.

Therefore, an electroluminescent element according to the invention is formed. In addition, in the device configuration described in Example 1, each the first light-emitting layer 512 and the second light-emitting layer 513 can exhibit light emission, so that a device that exhibits white light emission as a whole can be formed.

In this example, an anode is formed over a substrate; however, the invention is not limited thereto. A cathode can be formed over a substrate. In this case, that is, in case of exchanging an anode to cathode, lamination sequence of the electroluminescent layer described in this example is reversed.

In this example, the anode 501 is a transparent electrode in order to extract light generated in the electroluminescent layer 502 from the anode 501; however, the invention is not limited thereto. If the cathode 503 is formed by a selected material that is suitable for securing transmittance, light can be extracted from the cathode.

EXAMPLE 2

In this example, device characteristics of the electroluminescent element described in Example 1 having the configuration: ITO/Cu-Pc (20 nm)/α-NPD (30 nm)/CBP+Pt(ppy)acac: 15 wt % (20 nm)/BCP (30 nm)/CaF (2 nm)/Al(100 nm) will be explained. Emission spectrum of the electroluminescent element having the above described configuration is shown by spectrum 1 in FIG. 8, and FIG. 9. Each plot 1 in FIGS. 10 to 13 shows for electric characteristics.

Figure 8:
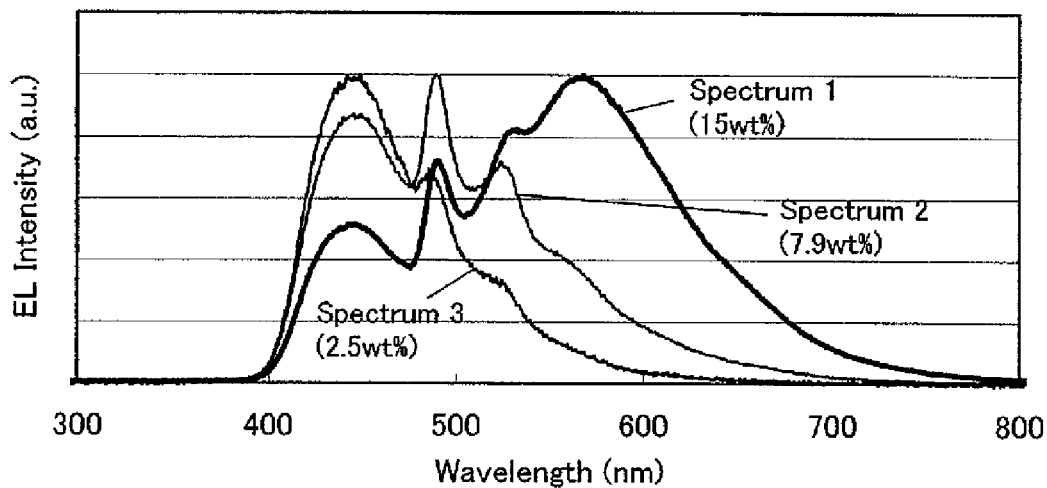
FIG. 8 shows an emission spectrum according to Example 2 and Comparative Example 1.

Spectrum 1 in FIG. 8 shows the emission spectrum of the electroluminescent element having the above described configuration at an applied current of 1 mA (at a luminance of approximately 960 cd/m²). From the result shown by spectrum 1, white light emission can be obtained having three components: blue emission from α-NPD composing the first light-emitting layer (around 450 nm); green emission from phosphorescent light emission of Pt(ppy)acac contained in a second light-emitting layer (around 490 nm, around 530 nm); and orange emission from excimer emission of Pt(ppy)acac contained in the second light-emitting layer. CIE chromaticity coordinate was (x, y)=(0.346, 0.397). The light emission was almost white in appearance.

Ionization potential of the α-NPD used for the first light-emitting layer and the CBP used for the second light-emitting layer was measured. The α-NPD had ionization potential of approximately 5.3 eV, and the CBP had that of approximately 5.9 eV. The difference in the ionization potential between the α-NPD and the CBP was approximately 0.6 eV. Therefore, preferable condition of the invention, that is, ionization potential of at least 0.4 eV, was satisfied. Consequently, it can be considered that the fact brought about good white light emission. In addition, the measurement of ionization potential was carried out with photoelectron spectrometer (AC-2) (RIKEN KEIKI Co., Ltd.).

Figure 9:
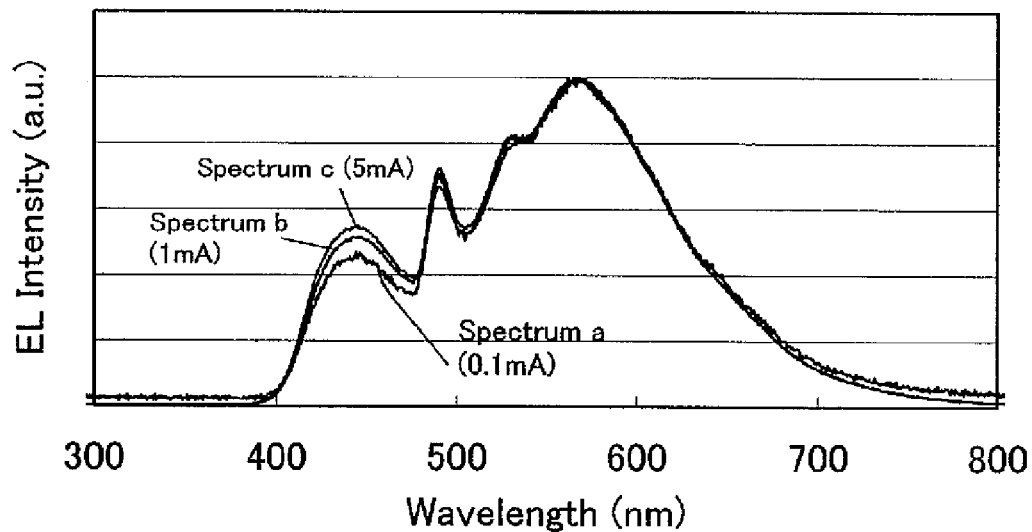
FIG. 9 shows current density dependence of an emission spectrum according to Example 2.

FIG. 9 shows measurement results of each spectrum at different amount of current flow in the electroluminescent element having the above described configuration. FIG. 9 shows measurement results at different amount of current flow denoted by spectrum a (0.1 mA), spectrum b (1 mA), and spectrum c (5 mA). Clearly from the measurement results, a spectral shape was hardly changed even when the amount of current flow was increased (luminance was increased). It can be considered that the electroluminescent element according to the invention exhibits stable white light emission, which is hardly affected by the change of the amount of current flow.

Figure 10:
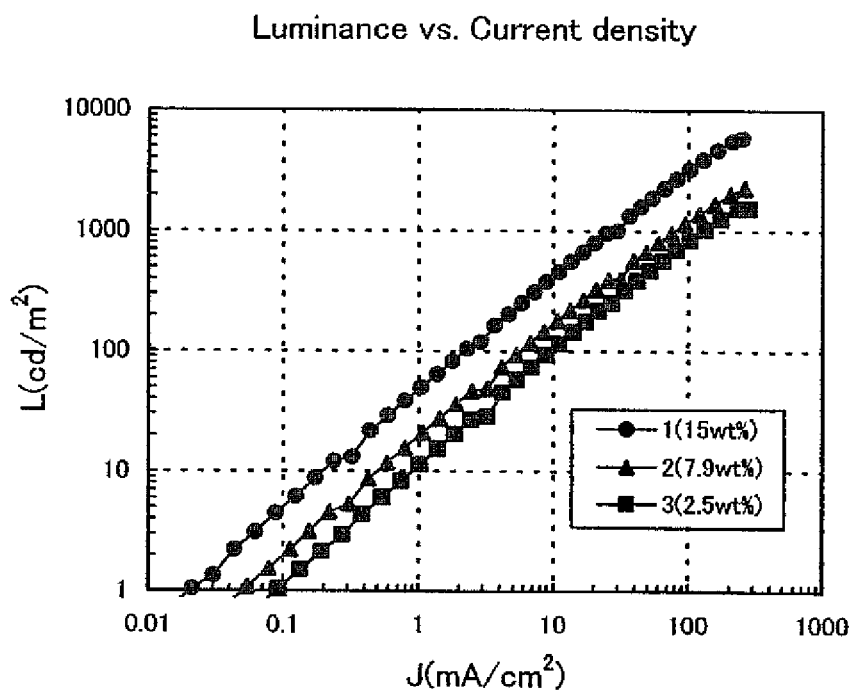
FIG. 10 shows luminance-current characteristics according to Example 2 and Comparative Example 1.

As electric characteristics of the electroluminescent element having the above described configuration, the luminance-current plot 1 in FIG. 10 shows that a luminance of approximately 460 cd/m² was obtained at a current density of 10 mA/cm².

Figure 11:
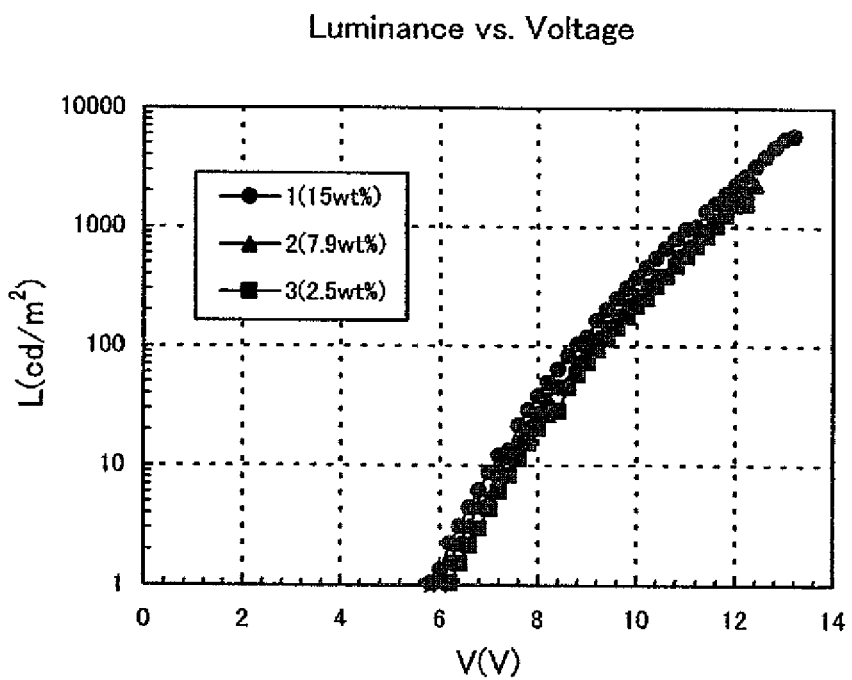
FIG. 11 shows luminance-voltage characteristics according to Example 2 and Comparative Example 1.

The luminance-voltage plot 1 in FIG. 11 shows that a luminance of approximately 120 cd/m² was obtained at an applied voltage of 9 V.

Figure 12:
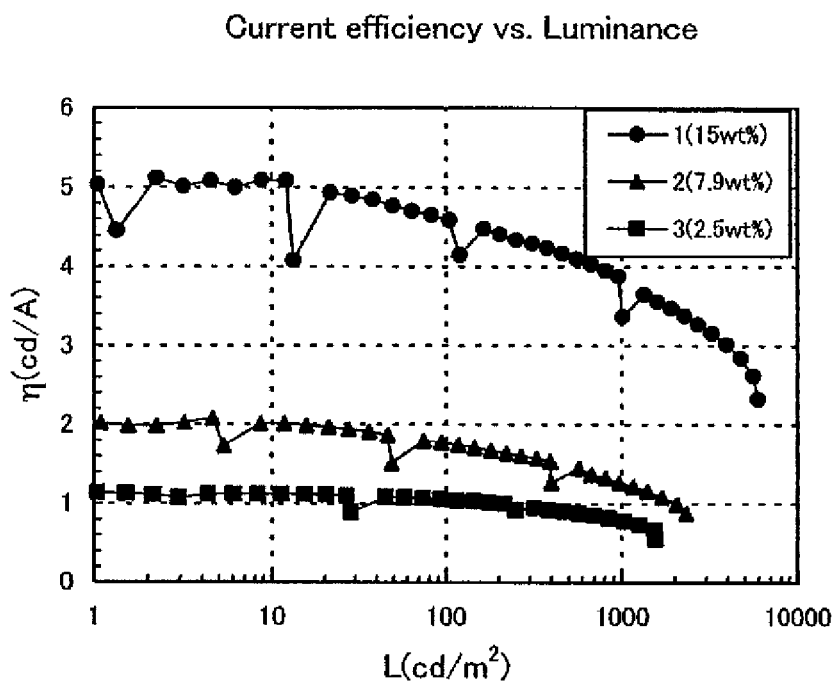
FIG. 12 shows current efficiency-current characteristics according to Example 2 and Comparative Example 1.

The current efficiency-luminance plot 1 in FIG. 12 shows that current efficiency of approximately 4.6 cd/A was obtained at a luminance of 100 cd/m².

Figure 13:
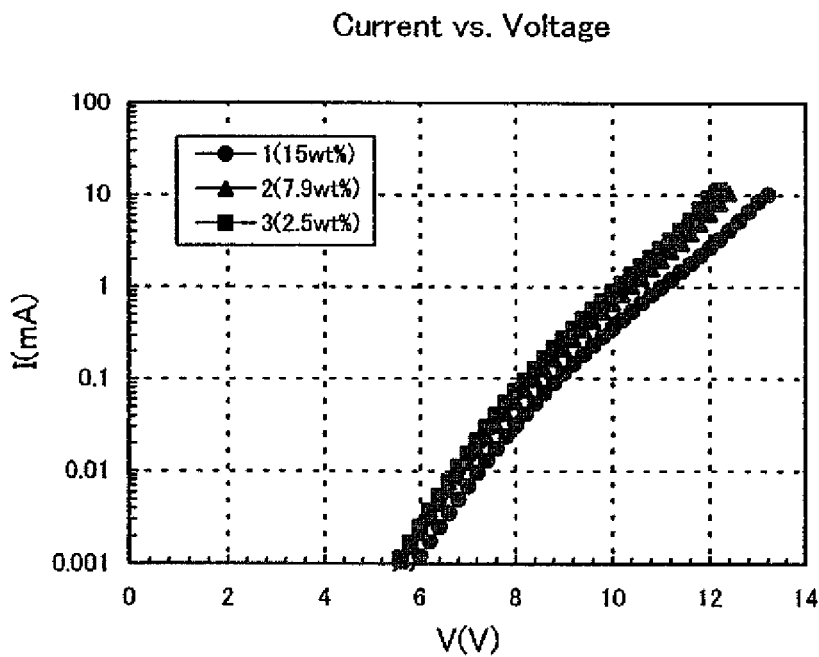
FIG. 13 shows current-voltage characteristics according to Example 2 and Comparative Example 1.

The current-voltage plot 1 in FIG. 13 shows that a current flow was approximately 0.12 mA at an applied voltage of 9 V.

The obtained amount of Pt in the above described electroluminescent element was 21 ng by quantitative determination by Inductively Coupled Plasma-Mass Spectrometry (ICP-MS). The obtained atomic concentration per unit area was $5.4 \times 10^{14}$ atoms/cm² by converting the amount of Pt.

Further, depth profiling of Pt concentration was conducted by Secondary Ion Mass Spectrometry (SIMS), and the above described amount of Pt was converted into the original amount, then, calculated the concentration of Pt per unit volume. In consequence, the maximum value of Pt concentration per unit was approximately $2.0 \times 10^{20}$ atoms/cm³, and $3.3 \times 10^{-4}$ mol/cm³ at mol concentration. Therefore, it can be considered that excimer emission becomes possible if the concentration of phosphorescent materials forming excimer is in the range of from $10^{-4}$ to 10 mol/cm⁻³.

As mentioned above, because of the fact that the maximum value of Pt concentration per unit volume is approximately $2.0 \times 10^{20}$ atoms/cm³, the average volume of one Pt complex is $5.0 \times 10^{-27}$ m³/atom. In case that the Pt complex is dispersed evenly, the Pt complex is dispersed in phosphorescent materials in the proportion of one Pt complex to 1.7 cubic nm by volume. Therefore, the distance between metal atoms each other of phosphorescent materials (in this example, Pt atom) is approximately 17 Å. Hence, the distance between central metals each other of phosphorescent materials is preferably at most 20 Å according to the invention.

COMPARATIVE EXAMPLE 1

Correspondingly, each spectrum 2 and spectrum 3 in FIG. 8 shows emission spectrum measured from an electroluminescent element in which a light-emitting layer comprise Pt(ppy)acac at different concentration from that described in Example 1. The spectrum 2 shows a measurement result in the case that concentration of Pt(ppy)acac is 7.9 wt %. The spectrum 3 shows a measurement result in the case that concentration of Pt(ppy)acac is 2.5 wt %. In each case, the spectrum was obtained at the current flow of 1 mA.

As shown by spectrum 3, in case that Pt(ppy)acac is contained at concentration of 2.5 wt %, blue emission from α-NPD composing a first light-emitting layer (around 450 nm) and green emission from Pt(ppy)acac contained in a second light-emitting layer (around 490 nm, around 530 nm) were only observed, and white light emission has not resulted. As shown in spectrum 2, in case that Pt(ppy)acac is contained at concentration of 7.9 wt %, a slight of excimer emission was in the spectrum as a shoulder at the vicinity of 560 nm; however the peak was insufficient, consequently, excellent white light emission could not be observed.

Further, current characteristics were measured from the devices. Each plot 2 in FIGS. 10 to 13 shows measurement results from the device containing Pt(ppy)acac at concentration of 7.9 wt %. Each plot 3 in FIGS. 10 to 13 shows measurement results from the device containing Pt(ppy)acac at concentration of 2.5 wt %.

The luminance-voltage characteristics in FIG. 10 show that a luminance of approximately 180 cd/m$^2$ was obtained from the device containing Pt(ppy)acac at concentration of 7.9 wt % and a luminance of approximately 115 cd/m$^2$ was obtained from the device containing Pt(ppy)acac at concentration of 2.5 wt % at a current density of 10 mA/cm$^2$, respectively.

The luminance-voltage characteristics in FIG. 11 show that a luminance of approximately 93 cd/m$^2$ was obtained form the device containing Pt(ppy)acac at concentration of 7.9 wt % and a luminance of approximately 73 cd/m$^2$ was obtained from the device containing Pt(ppy)acac at concentration of 2.5 wt % at an applied voltage of 9 V, respectively.

The current efficiency-luminance characteristics in FIG. 12 show that a current efficiency of approximately 1.8 cd/A was obtained from the device containing Pt(ppy)acac at concentration of 7.9 wt % and a current efficiency of approximately 1.1 cd/A was obtained from the device containing Pt(ppy)acac at concentration of 2.5 wt % at the luminance of 100 cd/m$^2$, respectively.

The current-voltage characteristics in FIG. 13 show that a current flow was approximately 0.21 mA in the device containing Pt(ppy)acac at concentration of 7.9 wt % and a current flow was approximately 0.27 mA in the device containing Pt(ppy)acac at concentration of 2.5 wt % at an applied voltage of 9 V, respectively.

The above measurement results (especially, from the result of the current-voltage characteristics shown in FIG. 13) provide the fact that the electroluminescent element according to the invention containing Pt(ppy)acac as guest materials in high concentration (15 wt %) has the same level of electric characteristics as those of the electroluminescent element containing Pt(ppy)acac as guest materials in such low concentration (7.9 wt %, 2.5 wt %).

EXAMPLE 3

In this example, an example for manufacturing a light-emitting device (top emission structure) having an electroluminescent element according to the present invention which exhibits white light emission over a substrate having an insulating surface will be explained with reference to FIG. 6. As used herein, the term "top emission structure" refers to a structure that light is extracted from the opposite side of a substrate having an insulating surface.

Figure 6A:
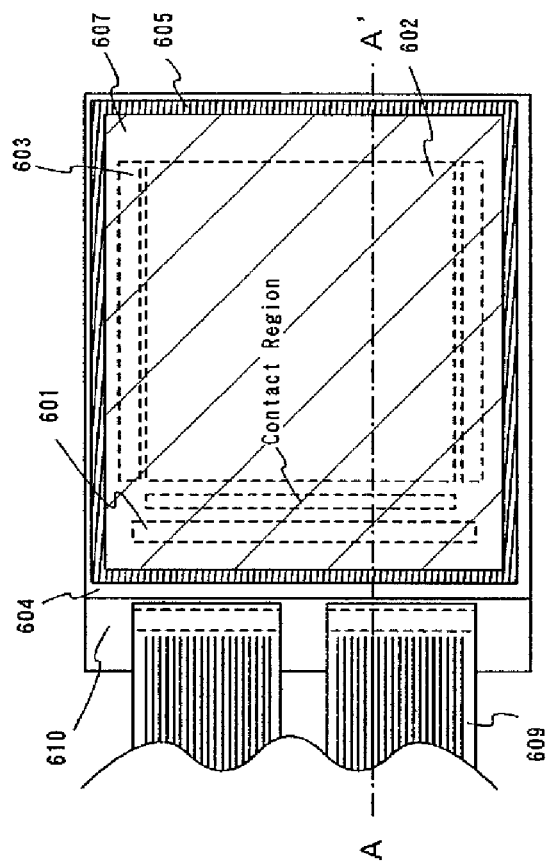
FIGS. 6A and 6B are schematic views of a light-emitting device according to the invention.
Figure 6B:
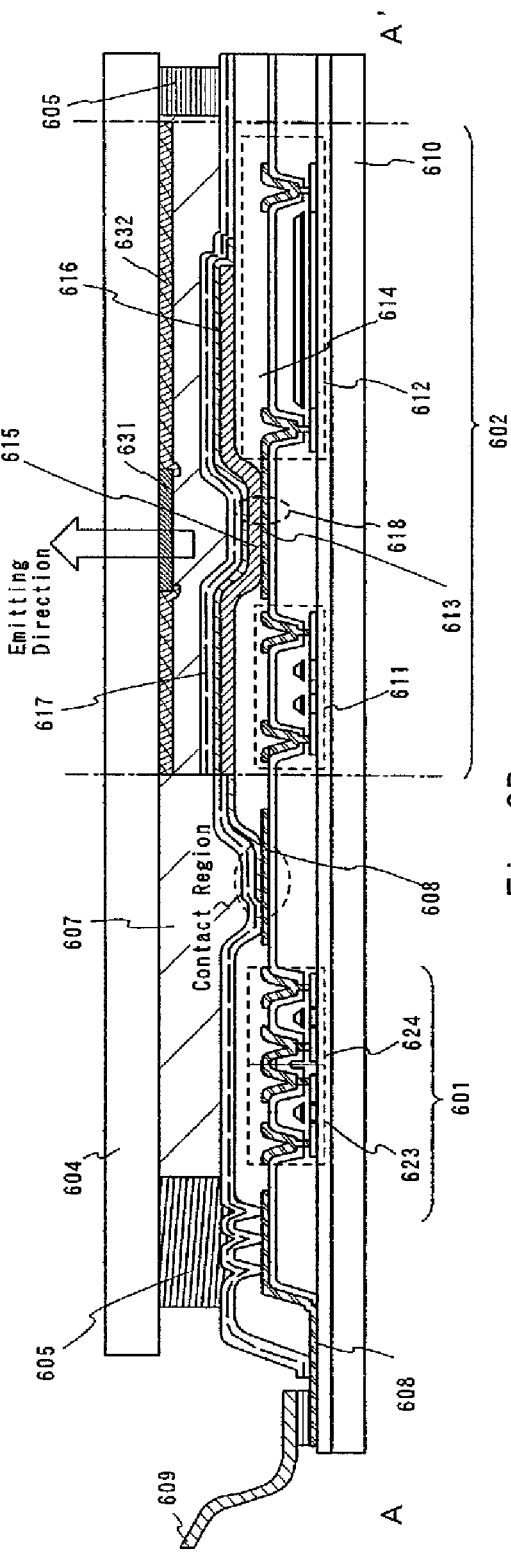

FIG. 6A is a top view of a light-emitting device. FIG. 6B is a cross-sectional view of FIG. 6A taken along the line A-A'. Reference numeral 601 indicated by a dotted line denotes a source signal line driver circuit; 602, a pixel portion; 603, a gate signal line driver circuit; 604, a transparent sealing substrate; 605, a first sealing agent; and 607, a second sealing agent. The inside surrounded by the first sealing agent 605 is filled with the transparent second sealing agent 607. In addition, the first sealing agent 605 contains a gap agent for spacing between substrates.

Reference 608 denotes a connecting wiring for transmitting signals inputted to the source signal line driver circuit 601 and the gate signal line driver circuit 603. The wiring receives video signals or clock signals from an FPC (flexible printed circuit) 609 serving as an external input terminal. Although only FPC is illustrated in the drawing, a PWB (printed wirings board) may be attached to the FPC.

Then, a cross-sectional structure will be explained with reference to FIG. 6B. A driver circuit and a pixel portion are formed over a substrate 610. In FIG. 6B, the source signal line driver circuit 601 and the pixel portion 602 are illustrated as a driver circuit.

The source signal line driver circuit 601 is provided with a CMOS circuit formed by combining an n-channel TFT 623 and a p-channel TFT 624. A TFT for forming a driver circuit may be formed by a known CMOS, PMOS, or NMOS circuit. In this example, a driver integrated type, that is, a driver circuit is formed over a substrate, is described, but not exclusively, the driver circuit can be formed outside instead of over a substrate. In addition, the structure of a TFT using a poly-silicon film as an active layer is not especially limited. A top gate TFT or a bottom gate TFT can be adopted.

The pixel portion 602 is composed of a plurality of pixels including a switching TFT 611, a current control IF 612, and a first electrode (anode) 613 connected to the drain of the current control TFT 612. The current control TFT 612 may be either an n-channel TFT or a p-channel TFT. In case that the current control TFT 612 is connected to an anode, the TFT is preferably a p-channel TFT In FIG. 6B, a cross-sectional structure of only one of thousands of pixels is illustrated to show an example that two TFTs are used for the pixel. However, three or more numbers of TFTs can be appropriately used.

Since the first electrode (anode) 613 is directly in contact with the drain of a TFT, a bottom layer of the first electrode (anode) 613 is preferably formed by a material capable of making an ohmic contact with the drain formed by silicon, and a top layer which is in contact with a layer containing an organic compound is preferably formed by a material having large work functions. In case of forming the first electrode (anode) by three layers structure comprising a titanium nitride film, a film containing aluminum as its main component, and a titanium nitride film, the first electrode (anode) can reduce resistance as a wiring, make a favorable ohmic contact, and function as an anode. Further, the first electrode (anode) 613 can be formed by a single layer such as a titanium nitride film, a chromium film, a tungsten film, a zinc film, or a platinum film; or a lamination layer composed of three or more layers.

Insulator (also referred to as a bank) 614 is formed at the edge of the first electrode (anode) 613. The insulator 614 may be formed by an organic resin film or an insulating film containing silicon. In this example, an insulator is formed by a positive type photosensitive acrylic film as the insulator 614 in the shape as illustrated in FIG. 6.

In order to make favorable coverage, an upper edge portion or a lower edge portion of the insulator 614 is formed to have a curved face having a radius of curvature. For example, in case that positive type photosensitive acrylic is used as a material for the insulator 614, only upper edge portion of the insulator 614 is preferably having a radius of curvature (from 0.2 to 3 μm). As the insulator 614, either a negative type photosensitive resin that becomes insoluble to etchant by light or a positive type photosensitive resin that becomes dissoluble to etchant by light can be used.

Further, the insulator 614 may be covered by a protective film formed by an aluminum nitride film, an aluminum nitride oxide film, a thin film containing carbon as its main component, or a silicon nitride film.

An electroluminescent layer 615 is selectively formed over the first electrode (anode) 613 by vapor deposition. Moreover, a second electrode (cathode) 616 is formed over the electroluminescent layer 615. As the cathode, a material having a small work function (Al, Ag, Li, Ca; or alloys of these elements such as Mg:Ag, Mg:In, or Al:Li; or CaN) can be used.

In order to pass light, the second electrode (cathode) 616 is formed by a lamination layer of a thin metal film having small work functions and a transparent conductive film (ITO, IZO, ZnO, or the like). An electroluminescent element 618 is thus formed comprising the first electrode (anode) 613, the electroluminescent layer 615, and the second electrode (cathode) 616.

In this example, the electroluminescent layer 615 is formed by a lamination structure explained in Example 1. That is, the electroluminescent layer 615 is formed by stacking sequentially Cu-Pc as a hole injecting layer (20 nm), α-NPD as a first light-emitting layer having hole transporting properties (30 nm), CBP+Pt(ppy)acac:15 wt % (20 nm) as a second light-emitting layer, and BCP as an electron transporting layer (30 nm). In addition, an electron injecting layer ($CaF_2$) is unnecessary in the device since the second electrode (cathode) is formed by a thin film metal film having small work functions.

Thus formed electroluminescent element 618 exhibits white light emission. In addition, a color filter comprising a coloring layer 631 and a light shielding layer (BM) 632 is provided to realize full color (for simplification, an over coat layer is not illustrated).

In order to seal the electroluminescent element 618, a transparent protective lamination layer 617 is formed. The transparent protective lamination layer 617 comprises a first inorganic insulating film, a stress relaxation film, and a second inorganic insulating film. As the first inorganic insulating film and the second inorganic insulating film, a silicon nitride film, a silicon oxide film, a silicon oxynitride film (composition ratio: N<O), a silicon nitride oxide film (composition ratio: N>O), or a thin film containing carbon as its main component (for example, a DLC film or a CN film) can be used. These inorganic insulating films have high blocking properties against moisture. However, when the film thickness is increased, film stress is also increased, consequently, film peeling is easily occurred.

By interposing a stress relaxation film between the first inorganic insulating film and the second inorganic insulating film, moisture can be absorbed and stress can be relaxed. Even when fine holes (such as pin holes) are existed on the first inorganic insulating film during forming the film for any reason, the stress relaxation film can fill the fine holes. The second inorganic insulating film formed over the stress relaxation film gives the transparent protective lamination film excellent blocking properties against moisture or oxygen.

Materials having smaller stress than that of an inorganic insulating film and hygroscopic properties are preferably used for the stress relaxation film. In addition, a material that is transparent to light is preferable. As the stress relaxation film, a film containing an organic compound such as α-NPD, BCP, MTDATA, or $Alq_3$ can be used. These films have hygroscopic properties and are almost transparent in case of having thin film thickness. Further, MgO, $SrO_2$, or SrO can be used as the stress relaxation film since they have hygroscopic properties and translucency, and can be formed into a thin film by vapor deposition.

In this example, a silicon nitride film which is formed by vapor deposition using a silicon target in the atmosphere containing nitrogen and argon to have high blocking properties against impurities such as moisture or alkaline metals is used as the first inorganic insulating film or the second inorganic insulating film. $Alq_3$ is deposited to form a thin film as the stress relaxation film by vapor deposition. In order to pass light through the transparent protective lamination layer, the total film thickness of the transparent protective lamination layer is preferably formed to be thin as possible.

In order to seal the electroluminescent element 618, the sealing substrate 604 is pasted with the first sealing agent 605 and the second sealing agent 607 in an inert gas atmosphere. Epoxy resin is preferably used for the first sealing agent 605 and the second sealing agent 607. It is desirable that the first sealing agent 605 and the second sealing agent 607 inhibit moisture or oxygen as possible.

In this example, as a material for the sealing substrate 604, a plastic substrate formed by FRP (Fiberglass-Reinforced Plastics), PVF (polyvinyl fluoride), Myler, polyester, acrylic, or the like can be used besides a glass substrate or a quartz substrate. After pasting the sealing substrate 604 with the first sealing agent 605 and the second sealing agent 607, a third sealing agent can be provided to seal the side face (exposed face).

By encapsulating the electroluminescent element 618 in the first sealing agent 605 and the second sealing agent 607, the electroluminescent element 618 can be shielded completely from outside to prevent moisture or oxygen that brings deterioration of the electroluminescent layer 615 from penetrating into the electroluminescent element 618. Therefore, a high reliable light-emitting device can be obtained.

If a transparent conductive film is used as the first electrode (anode) 613, a dual emission device can be manufactured.

The light-emitting device according to this example can be practiced by utilizing not only the device configuration of the electroluminescent device explained in Example 1 but also combining the configuration of the electroluminescent device formed according to the invention with that explained in Example 1.

EXAMPLE 4

Various electric appliances completed by using a light-emitting device having an electroluminescent element according to the present invention will be explained in this example.

Given as examples of such electric appliances manufactured by using the light-emitting device having the electroluminescent element according to the invention: a video camera, a digital camera, a goggles-type display (head mount display), a navigation system, a sound reproduction device (a car audio equipment, an audio set and the like), a laptop personal computer, a game machine, a portable information terminal (a mobile computer, a cellular phone, a portable game machine, an electronic book, or the like), an image reproduction device including a recording medium (more specifically, a device which can reproduce a recording medium such as a digital versatile disc (DVD) and so forth, and includes a display for displaying the reproduced image), or the like. FIGS. 7A to 7G show various specific examples of such electric appliances.

Figure 7A:
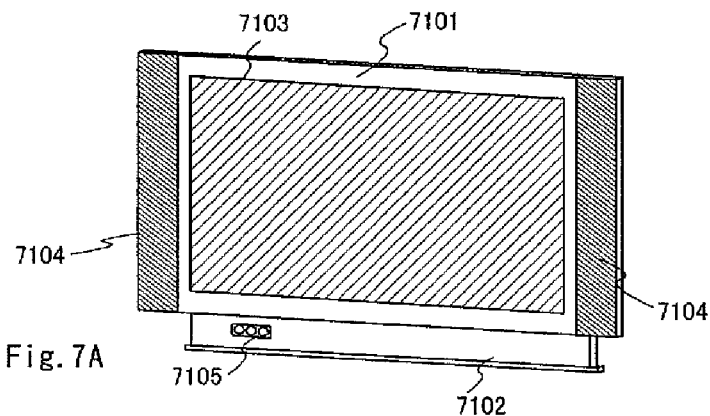
FIGS. 7A to 7G are examples of electric appliances using a light-emitting device according to the invention.

FIG. 7A illustrates a display device which includes a frame 7101, a support table 7102, a display portion 7103, a speaker portion 7104, a video input terminal 7105, or the like. The light-emitting device using the electroluminescent element according to the invention can be used for the display portion 7103. The display device is including all of the display devices for displaying information, such as a personal computer, a receiver of TV broadcasting, and an advertising display.

Figure 7B:
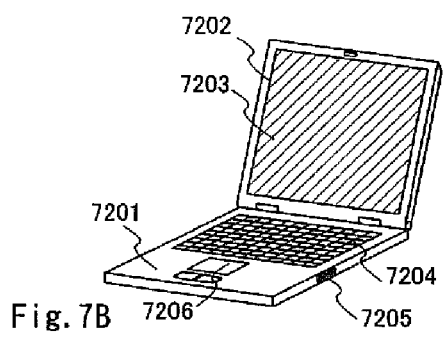

FIG. 7B illustrates a laptop computer which includes a main body 7201, a casing 7202, a display portion 7203, a keyboard 7204, an external connection port 7205, a pointing mouse 7206, or the like. The light-emitting device using the electroluminescent element according to the invention can be used to the display portion 7203.

Figure 7C:
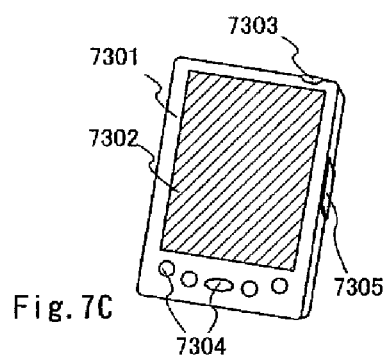

FIG. 7C illustrates a mobile computer which includes a main body 7301, a display portion 7302, a switch 7303, an operation key 7304, an infrared port 7305, or the like. The light-emitting device using the electroluminescent element according to the invention can be used to the display portion 7302.

Figure 7D:
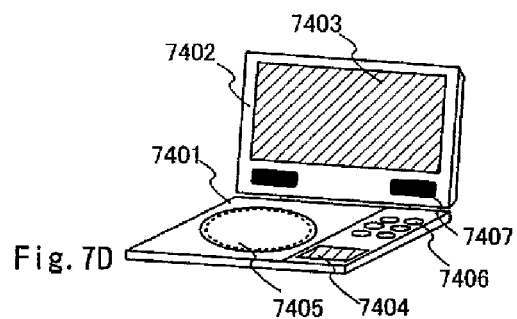

FIG. 7D illustrates an image reproduction device including a recording medium (more specifically, a DVD reproduction device), which includes a main body 7401, a casing 7402, a display portion A 7403, another display portion B 7404, a recording medium (DVD or the like) reading portion 7405, an operation key 7406, a speaker portion 7407 or the like. The display portion A 7403 is used mainly for displaying image information, while the display portion B 7404 is used mainly for displaying character information. The light-emitting device using the electroluminescent element according to the invention can be used to the display portion A 7403 and the display portion B 7404. Note that the image reproduction device including a recording medium further includes a domestic game machine or the like.

Figure 7E:
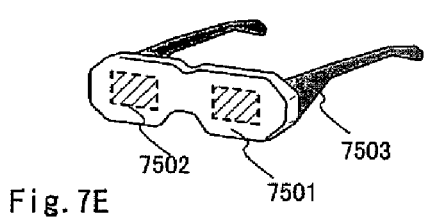

FIG. 7E illustrates a goggle type display (head mounted display), which includes a main body 7501, a display portion 7502, and an arm portion 7503. The light-emitting device using the electroluminescent element according to the invention can be used to the display portion 7502.

Figure 7F:
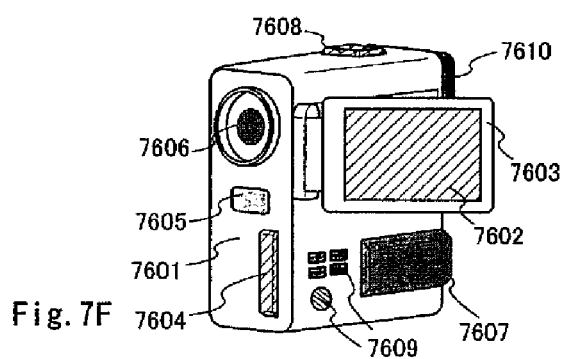

FIG. 7F illustrates a video camera which includes a main body 7601, a display portion 7602, an casing 7603, an external connecting port 7604, a remote control receiving portion 7605, an image receiving portion 7606, a battery 7607, a sound input portion 7608, an operation key 7609, an eyepiece portion 7610 or the like. The light-emitting device using the electroluminescent element according to the invention can be used to the display portion 7602.

Figure 7G:
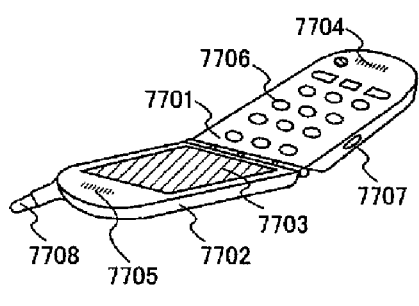

FIG. 7G illustrates a cellular phone which includes a main body 7701, a casing 7702, a display portion 7703, a sound input portion 7704, a sound output portion 7705, an operation key 7706, an external connecting port 7707, an antenna 7708, or the like. The light-emitting device using the electroluminescent element according to the invention can be used to the display portion 7703. Note that the display portion 7703 can reduce power consumption of the cellular phone by displaying white-colored characters on a black-colored background.

Additionally, the electroluminescent element according to the invention can be applied to lighting equipment, wall of establishment, or the like which serves as a surface light source.

As mentioned above, an application range of the light-emitting device using the electroluminescent element according to the invention is extremely wide. Further, the electroluminescent element according to the invention can be easily controlled the color balance in white light emission (white balance). Therefore, a well color balanced display can be realized in electric appliances in various fields by applying the electroluminescent element according to the invention thereto.

Although the present invention has been fully described by way of examples with reference to the accompanying drawings, it is to be understood that various changes and modifications will be apparent to those skilled in the art. Therefore, unless otherwise such changes and modifications depart from the scope of the present invention hereinafter described, they should be construed as being included therein.

What is claimed is:

1. A lighting equipment comprising:
a first electrode;
a second electrode over the first electrode;
a first light-emitting layer between the first electrode and the second electrode; and
a second light-emitting layer between the first electrode and the second electrode,
wherein the second light-emitting layer comprises a phosphorescent material at a concentration of 10 to 40 wt %,
wherein one of the first electrode and the second electrode has light shielding property,
wherein the first light-emitting layer and the second light-emitting layer overlap with each other physically, and
wherein the first light-emitting layer and the second light-emitting layer are in contact with each other.

2. The lighting equipment according to claim 1, wherein the second light-emitting layer comprises the phosphorescent material at a concentration of 12.5 to 20 wt %.

3. The lighting equipment according to claim 1, wherein an emission peak of the first light-emitting layer is smaller than an emission peak of the second light-emitting layer.

4. The lighting equipment according to claim 1, wherein the phosphorescent material is an organometal complex with platinum as a central metal.

5. The lighting equipment according to claim 1, wherein an energy gap between a LUMO level of the first light-emitting layer and a LUMO level of the second light-emitting layer is larger than 0.3 eV.

6. The lighting equipment according to claim 1, wherein the lighting equipment is configured to emit white light.

7. The lighting equipment according to claim 1,
further comprising a transparent protective layer over the second electrode,
wherein the transparent protective layer comprises a first inorganic film, an organic film over the first inorganic film, and a second inorganic film over the organic film.

8. A lighting equipment comprising:
a first electrode;
a second electrode over the first electrode;
a first light-emitting layer between the first electrode and the second electrode; and
a second light-emitting layer between the first electrode and the second electrode,
wherein the second light-emitting layer comprises a phosphorescent material at a concentration of $10^{-4}$ to $10^{-3}$ mol/cm$^3$,
wherein the first light-emitting layer and the second light-emitting layer overlap with each other physically, and wherein the first light-emitting layer and the second light-emitting layer are in contact with each other.

9. The lighting equipment according to claim 8, wherein one of the first electrode and the second electrode has light shielding property.

10. The lighting equipment according to claim 8, wherein the second light-emitting layer contains the phosphorescent material at a concentration of 12.5 to 20 wt %.

11. The lighting equipment according to claim 8, wherein an emission peak of the first light-emitting layer is smaller than an emission peak of the second light-emitting layer.

12. The lighting equipment according to claim 8, wherein the phosphorescent material is an organometal complex with platinum as a central metal.

13. The lighting equipment according to claim 8, wherein an energy gap between a LUMO level of the first light-emitting layer and a LUMO level of the second light-emitting layer is larger than 0.3 eV.

14. The lighting equipment according to claim 8, wherein the lighting equipment is configured to emit white light.

15. The lighting equipment according to claim 8,
further comprising a transparent protective layer over the second electrode,
wherein the transparent protective layer comprises a first inorganic film, an organic film over the first inorganic film, and a second inorganic film over the organic film.

16. A lighting equipment comprising:
a first electrode;
a second electrode over the first electrode;
a first light-emitting layer between the first electrode and the second electrode; and
a second light-emitting layer between the first electrode and the second electrode,
wherein the second light-emitting layer comprises phosphorescent materials,
wherein two central metals of the phosphorescent materials are at a distance of 2 to 20 Å from each other,
wherein the first light-emitting layer and the second light-emitting layer overlap with each other physically, and
wherein the first light-emitting layer and the second light-emitting layer are in contact with each other.

17. The lighting equipment according to claim 16, wherein one of the first electrode and the second electrode has light shielding property.

18. The lighting equipment according to claim 16, wherein the second light-emitting layer comprises the phosphorescent materials at a concentration of 12.5 to 20 wt %.

19. The lighting equipment according to claim 16, wherein an emission peak of the first light-emitting layer is smaller than an emission peak of the second light-emitting layer.

20. The lighting equipment according to claim 16, wherein the phosphorescent materials are an organometal complex with platinum as a central metal.

21. The lighting equipment according to claim 16, wherein an energy gap between a LUMO level of the first light-emitting layer and a LUMO level of the second light-emitting layer is larger than 0.3 eV.

22. The lighting equipment according to claim 16, wherein the lighting equipment is configured to emit white light.

23. The lighting equipment according to claim 16,
further comprising a transparent protective layer over the second electrode,
wherein the transparent protective layer comprises a first inorganic film, an organic film over the first inorganic film, and a second inorganic film over the organic film.

* * * * *